(12) United States Patent
Sauer et al.

(10) Patent No.: US 9,153,971 B2
(45) Date of Patent: Oct. 6, 2015

(54) HOUSING FOR ACCOMMODATING AN ELECTRONIC CIRCUIT

(75) Inventors: Thomas Sauer, Mulfingen (DE); Dieter Best, Mad Mergentheim (DE); Walter Matter, Krautheim (DE); Joachim Berberich, Buchen-Rinschheim (DE)

(73) Assignee: ebm-pabst Mulfingen GmbH & Co. KG, Mulfingen (DE)

( * ) Notice: Subject to any disclaimer, the term of this patent is extended or adjusted under 35 U.S.C. 154(b) by 0 days.

(21) Appl. No.: 14/352,234

(22) PCT Filed: Nov. 30, 2011

(86) PCT No.: PCT/EP2011/071342
§ 371 (c)(1),
(2), (4) Date: Apr. 16, 2014

(87) PCT Pub. No.: WO2013/079102
PCT Pub. Date: Jun. 6, 2013

(65) Prior Publication Data
US 2014/0252898 A1    Sep. 11, 2014

(51) Int. Cl.
| H05K 5/06 | (2006.01) |
| H02K 5/10 | (2006.01) |
| H02J 7/00 | (2006.01) |
| H02J 3/32 | (2006.01) |
| H02J 3/24 | (2006.01) |

(52) U.S. Cl.
CPC ... *H02J 7/00* (2013.01); *H02J 3/24* (2013.01); *H02J 3/32* (2013.01); *H02J 7/007* (2013.01); *H02J 7/0013* (2013.01); *H02K 5/10* (2013.01); *H05K 5/068* (2013.01)

(58) Field of Classification Search
CPC ............ H05K 5/00; H05K 5/04; H05K 5/06; H05K 5/068; H02G 3/08; H02G 3/081; H02G 3/088; H02J 7/00; H02J 3/32; H02J 3/24; H02J 7/0013; H02J 7/007; H02K 5/10

USPC ........... 174/50, 50.5, 520, 50.52, 50.54, 522, 174/525, 535, 17 R, 17.05, 17 VA; 200/83 N; 310/88
See application file for complete search history.

(56) References Cited

U.S. PATENT DOCUMENTS

| 4,145,588 A | * | 3/1979 | Orcutt ........................ 200/83 N |
| 5,434,748 A | * | 7/1995 | Fukui et al. ................... 174/559 |

(Continued)

FOREIGN PATENT DOCUMENTS

| DE | 42 17 837 A1 | 12/1992 |
| DE | 10 2004 012 229 A1 | 9/2005 |

(Continued)

OTHER PUBLICATIONS

PCT International Search Report—Apr. 10, 2012.

*Primary Examiner* — Angel R Estrada
(74) *Attorney, Agent, or Firm* — Brinks Gilson & Lione (57) ABSTRACT

A housing for receiving an electronic circuit (4) having a plurality of components (5) having a carrier plate (7) and a housing cover (8) including a circumferentially enclosing wall (9) on the carrier plate (7) and a cover part (10) on the wall (9), which cover part (10) lies opposite the carrier plate (7). A volume compensation element (11) is attached on the carrier plate (7) in an interior (12) of the housing cover (8) which is enclosed in a pressure-tight manner from an external atmosphere. The volume compensation element (11) is elastically formed providing a variable volume for compensation of pressure fluctuations in the interior (12), which variable volume occurs with a change in position of the volume compensation element (11) relative to the carrier plate (7). A gap between the volume compensation element (11) and the carrier plate (7) is connected to the external atmosphere.

14 Claims, 5 Drawing Sheets

(56) References Cited

U.S. PATENT DOCUMENTS 6,297,448 B1 * 10/2001 Hara ............................. 174/50.5
6,426,461 B1 * 7/2002 Ginter et al. ................. 174/50.5
7,838,768 B2 * 11/2010 Zadach et al. ............... 174/50.5
8,897,031 B2 * 11/2014 Kanou ........................... 174/50

FOREIGN PATENT DOCUMENTS

EP  1 560 319 A1  8/2004

* cited by examiner

HOUSING FOR ACCOMMODATING AN ELECTRONIC CIRCUIT

CROSS REFERENCE TO RELATED APPLICATION

This application claims priority to PCT/EP2011/071342, filed on Nov. 30, 2011.

FIELD OF THE INVENTION

The present invention relates to a housing to receive an electronic circuit made of a plurality of components, comprised of a carrier plate and a housing cover, including a circumferentially enclosing wall disposed on the carrier plate and a cover part disposed on the wall, lying opposite the carrier plate.

BACKGROUND

Electronic components must generally be protected from moisture. It is therefore known that one e.g. applies a moisture-proof lacquer on a circuit board of an electronic circuit and on the components attached to the circuit board. This method, however, is only suitable for slight condensation of moisture.

It is further known that the electronic components are cast in a sealing compound (potting) which, however, entails disadvantages with respect to the thermo-mechanical forces arising, which act on the components and can damage them.

It is further known to use a leak-proof housing which is provided with a pressure-equalizing membrane, a so-called Gore membrane. In this case there is the disadvantage that an exchange of air takes place with the environment, and penetration of moisture into the housing is thereby possible.

The object of the present invention is to eliminate the above-mentioned disadvantages and provide a housing for electronic components which ensures an improved moisture protection of the components, and to be sure even with large temperature fluctuations of the ambient temperature, in particular from −40° C. to +60° C.

SUMMARY AND INTRODUCTORY DESCRIPTION OF THE INVENTION

The above object is inventively achieved in that a volume compensation element is attached on a carrier plate in an interior space of the housing cover which is enclosed in a pressure-tight manner with respect to an external atmosphere or environment, and said volume compensation element is elastically formed such that there is a variable volume for compensation of pressure fluctuations occurring in the interior, which variable volume is due to a change in position of the volume compensation element with respect to the carrier plate, and a gap between the volume compensation element and the carrier plate is connected to the external atmosphere or environment. According to the invention, the pressure compensation between interior and exterior spaces, i.e. the external atmosphere, which is required due to temperature fluctuations in the interior, occurs by means of a volume compensation and not a mass balancing, such as for example with the known pressure-equalizing membrane. The temperature influences occurring due to a self-heating of the motor are also controlled by the invention. In this case it is inventively expedient in particular, if the construction space, i.e. the interior, between the volume compensation element and the housing cover is dimensioned such that a volume compensation of between 20% and 35% of the interior volume can be realized by the stroke of the volume compensation element, wherein in particular the air volume present is held as low as possible by achieving a high degree of fill by the electronic circuit and possibly additional volume elements present. It is inventively advantageous, if the volume compensation element is attached in the form of an inlay component, wherein the volume compensation element preferably is constructed with a disc-shaped. Here the volume compensation element is in the form of an external attachment section and an internal membrane section which are circumferentially connected to each other via a resilient connecting part. Because of this inventive design, the external attachment section between the housing cover and the carrier plate is fixed and the central membrane section can move in a membrane-like manner with respect to the fixed attachment section.

Furthermore it is inventively advantageous, if the attachment section has a sealing profile in its circumferential edge region for a pressure-tight attachment between the wall and the carrier plate, so that the sealing profile forms an assembly unit with the volume compensation element, since it is for example injection-molded on the attachment section. The attachment section and the membrane section are for example formed of a hard plastic, whereas the elastic connection section is formed of a resiliently-acting plastic and the edge-side sealing profile of a soft plastic, which is usually used for the manufacture of seals, for example O-seal-rings. The attachment section of the volume compensation element advantageously abuts on the carrier plate in parallel orientation thereto. In order to make possible a sufficient displacement (stroke) of the membrane section with respect to the attachment section towards the stator flange, whereby a volume enlargement of the interior results, the carrier plate has a depression in the region below the membrane section in which the membrane section can be received in terms of shape and volume. Furthermore it can be expedient, if upon a movement of the membrane section towards the circuit board the stroke path is bounded, which is advantageously achieved by stops formed on the membrane section.

Since according to the invention only a very small volume of air is present inside the interior, only a minimal amount of moisture is also enclosed in this air volume. As a result, the maximum amount of moisture which can be present in the air volume cannot lead to damage of the electronic components. In order to the keep the air volume inside the interior as small as possible, it is furthermore inventively expedient, if volume elements are provided in the edge region of the circuit board on the side of the volume compensation element facing the circuit board, i.e. between the wall of the housing and the electronic components. It is inventively also optionally possible to provide an inlay component above the circuit board in the gap between the circuit board and the housing cover for reduction of air volume. Due to the inventive design, no further moisture can penetrate into the interior of the housing between the volume compensation element and the housing cover via volume compensation, whereby accumulation of moisture cannot occur, since no mass transport into the housing can occur. Furthermore, the inventive pressure equalization serves to clamp the sealing elements present, since internal and external pressure on the sealing elements compensate approximately equally. A complete sealing with respect to the external environment, i.e. atmosphere, is also provided by the inventive volume compensation element in the region of feedthroughs which for example serve for the feed-through of connecting pins or the like.

BRIEF DESCRIPTION OF THE DRAWINGS

Advantageous embodiments of the invention are contained in the dependent claims and are described in more detail with reference to the accompanying drawings:

FURTHER DETAILED DESCRIPTION OF THE INVENTION

In FIGS. 1 to 7, identical parts or functionally identical parts are indicated by the same reference numbers. Insofar as specific features of the inventive housing or volume compensation element or their components, which features are described and/or inferable from the drawings, are described only in the context of an exemplary embodiment, according to the invention these features are also significant independent of this exemplary embodiment as individual features or, however, also in combination with other features of the exemplary embodiment and are claimed as belonging to the invention.

Figure 1:
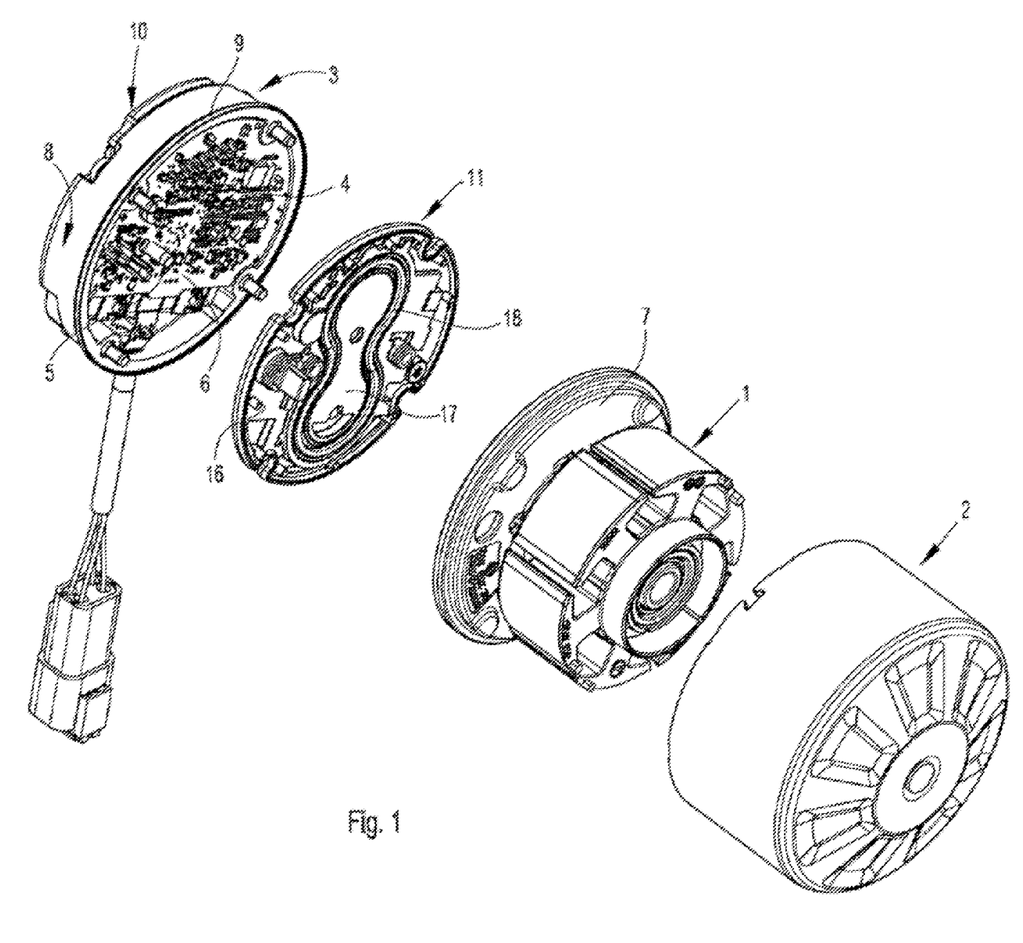
FIG. 1 shows an exploded view of an electric motor including an inventive housing.

FIG. 1 shows a perspective exploded view of an electric motor, formed of a stator 1 and a rotor 2 as well as an electronics housing 3, wherein an electronic circuit 4 made of components 5 and a circuit board 6 is disposed. The electronics housing 3 is formed from a carrier plate 7 and a housing cover 8. In the illustrated exemplary embodiment the carrier plate 7 is formed as a stator flange of the electric motor. The housing cover 8 is formed from a circumferentially enclosing wall 9 which is mountable in a pressure-tight manner on the carrier plate 7, and a cover part 10 connected to the wall 9 and opposite the cover plate 7, and is, e.g., screwed to the cover plate 7.

It is inventively provided that a volume compensation element 11 is disposed on the carrier plate 7, which volume compensation element 11 is thus disposed between an interior 12 of the housing cover 8, which interior 12 contains the electronic circuit 4, and the carrier plate 7, and separates the interior 12 from the carrier plate 7 and the construction parts which are incidentally connected to the carrier plate 7, in the present case the electric motor comprised of stator 1 and rotor 2. As is clear in particular from FIG. 2, in the mounted state of the housing cover 8 on the carrier plate 7, the volume compensation element 11 is attached to the stator flange using the wall 9 and effected is a circumferential sealing of an interior 12 located inside the housing cover 8 with respect to the atmosphere (environment) incorporated in the electronics housing 3.

Figure 2:
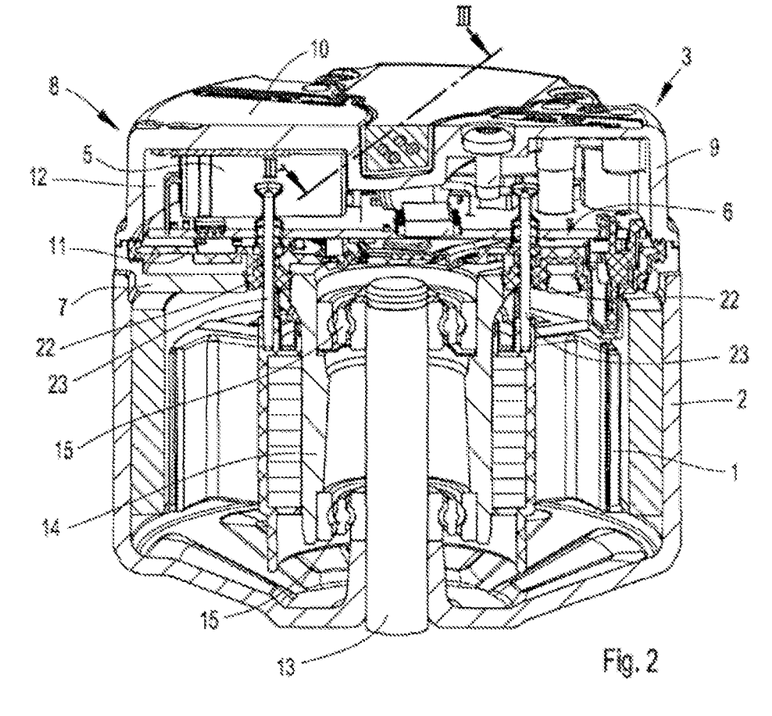
FIG. 2 shows a longitudinal cut through an electric motor according to FIG. 1 in the assembled state.
Figure 3:
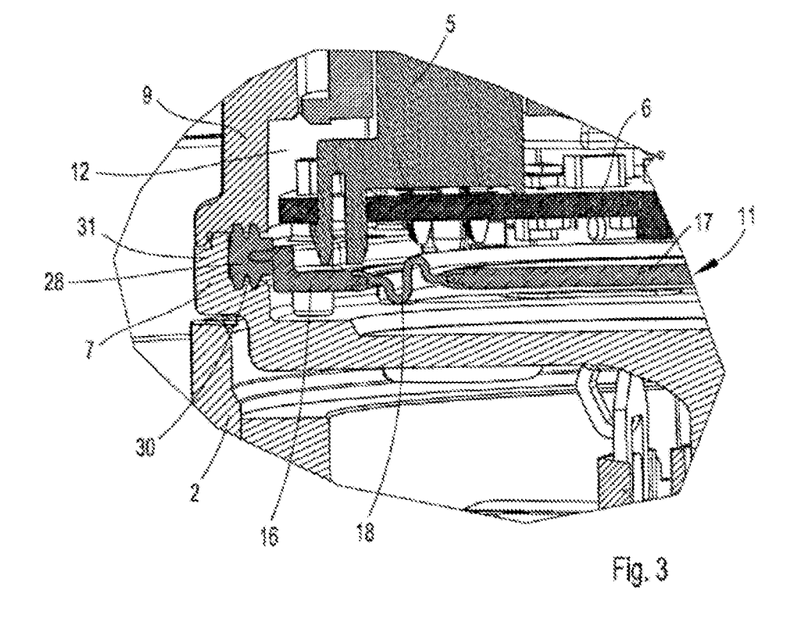
FIG. 3 shows an enlarged partial section according to III-III in FIG. 2.

The electric motor illustrated is formed as an external rotor motor, so that the rotor 2 constructed in a bell-shape circumferentially encloses the stator 1. The rotor 2 is supported via bearing elements 15 across a shaft 13 inside a bearing support tube 14 which is constructed on the carrier plate 7 that is formed as a stator flange. Reference is made here to FIG. 2.

Figure 4:
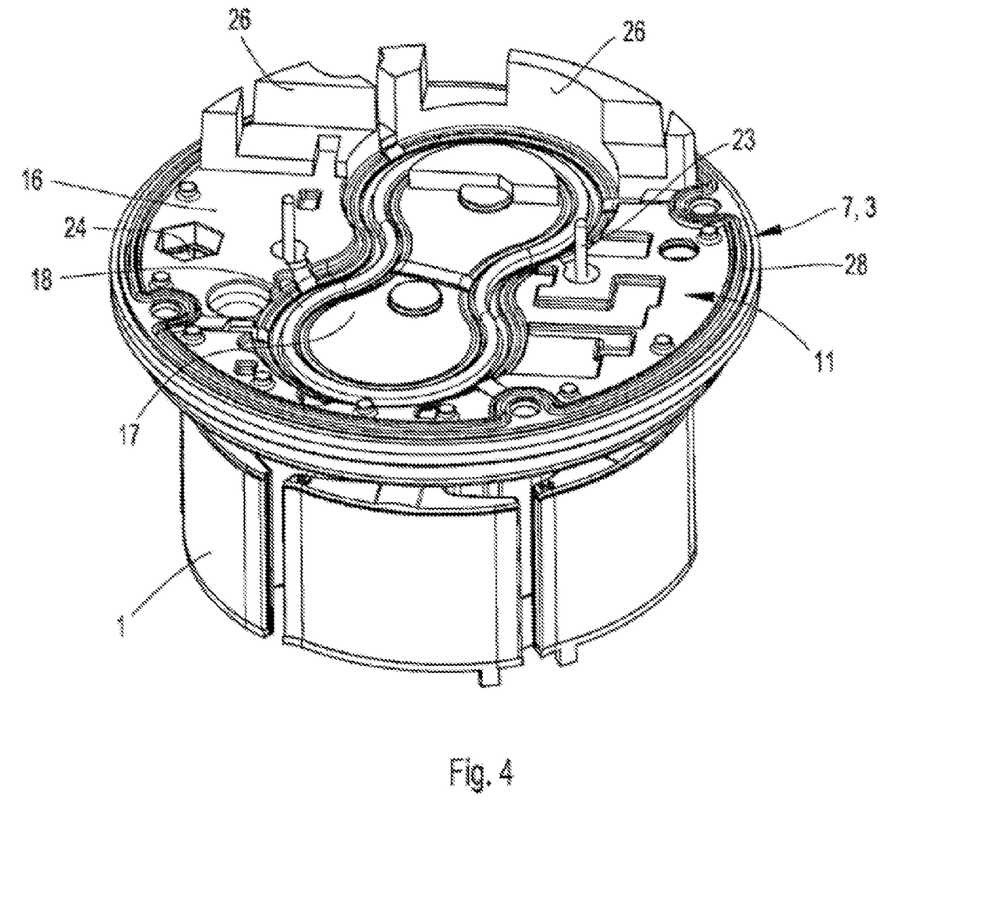
FIG. 4 shows a view of a stator of the electric motor according to FIG. 1 including a mounted inventive volume compensation element.
Figure 5:
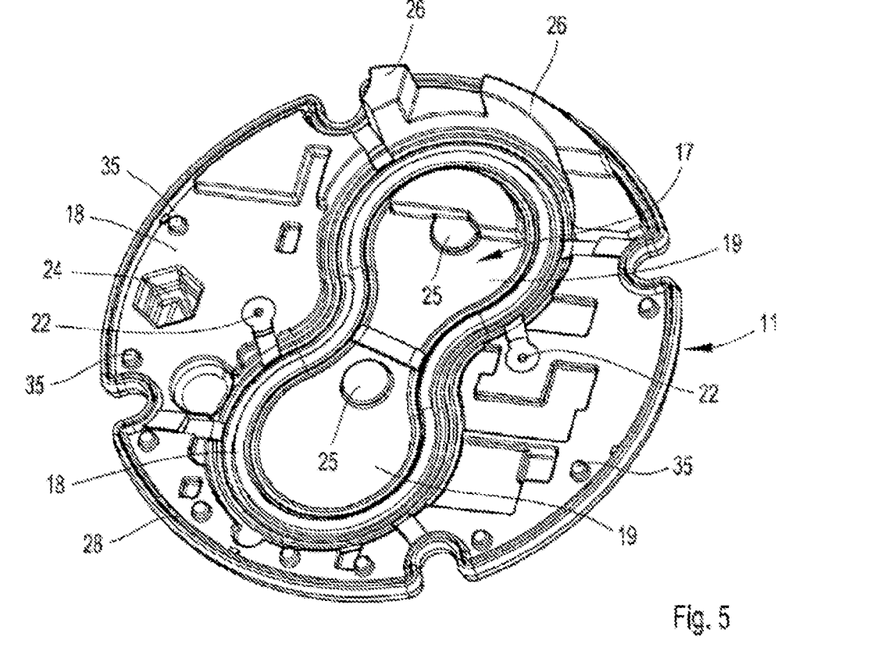
FIG. 5 shows a view of a top side of the inventive volume compensation element according to FIG. 4.
Figure 6:
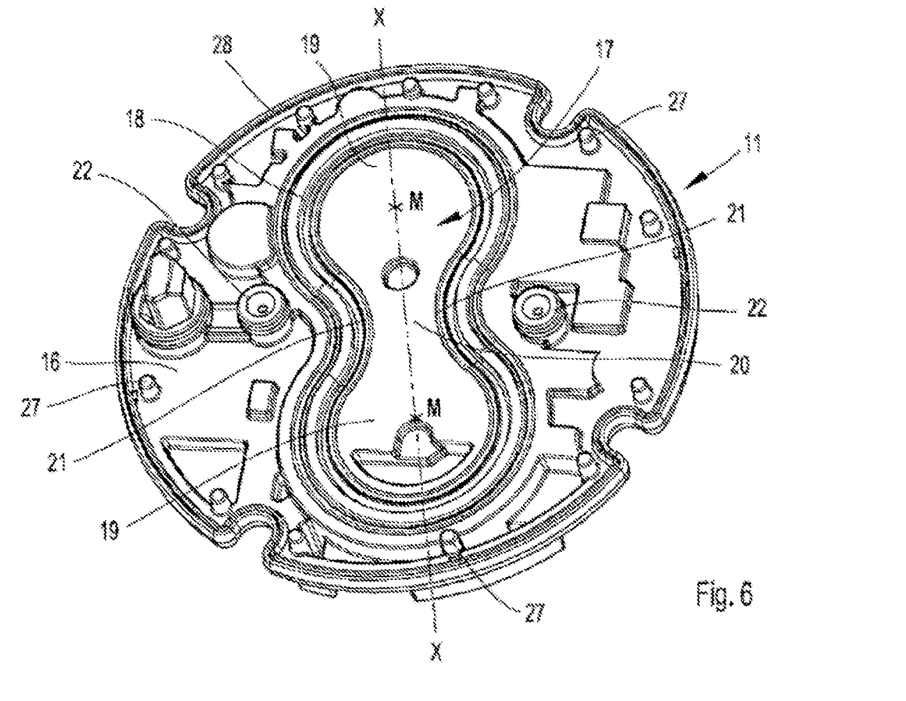
FIG. 6 shows a view of a bottom side of the volume compensation element according to FIG. 5.

As can be seen from FIG. 4, the volume compensation element 11 is mounted on the carrier plate 7. As is illustrated in FIGS. 5 and 6, the volume compensation element is formed of an external, circumferentially enclosing attachment section 16 and a central membrane section 17 which is changeable in position with respect to the attachment section. The membrane section 17 is connected to the attachment section 16 via a resiliently deformable, circumferentially enclosed, connecting section 18. The attachment section 16 and the membrane section 17 are formed of a harder material than the material of the connecting section 18. The connecting section 18 is preferably formed of a thermoplastic elastomer having a Shore A hardness of 30 to 60, preferably 35. a polypropylene, e.g. PPH, is preferably used as material for the manufacturing of the attachment section 16 and of the membrane section 17. The thickness of the attachment section 16 and of the membrane section 17 is small with respect to their width or longitudinal extension, so that the volume compensation element 11 is disc-shaped and advantageously 2 to 4 mm thick and thus the membrane section 17 has a low mass. Due to the resilient design of the connecting section 18, the membrane section 17 can move with respect to the attachment section 16, if, for example, vertical forces act on the membrane section 17. With a vertical application of force a virtually parallel displacement of the membrane section 17 with respect to the attachment section 16 results. As soon as a force action of this type is no longer present, the membrane section 17 springs back to its initial position, wherein it is located in the same plane as the attachment section 16. The volume compensation element 11 is formed in the region of its attachment section 16 such that the attachment section 16 abuts circumferentially on the support plate 7 in a plane parallel to the carrier plate 7 and without tilting. In the illustrated exemplary embodiment, the membrane section 17 is formed, such that it is formed of two main sections 19 having a circular outline contour, which two main sections 19 are connected to each other via a spacer section 20. The two main sections 19 have the same size and the spacer section 20 has concavely curved longitudinal edges 21, wherein the membrane section 17 is formed mirror-symmetrical to a connecting line X-X through the midpoint M of the circular main section 19.

The volume compensation element 11 is preferably formed as a multiple-component plastic injection-molded part. As can further be seen, in the attachment section 16 the volume compensation element 11 has feed-throughs 22 for contact pins 23, which are sealed pressure-tight with respect to an external atmosphere, wherein in the illustrated exemplary embodiment the contact pins 23 are pins for the feed-through of the winding terminals of a motor winding located in the electric motor to the electronic circuit 4. Furthermore, the attachment section 16 has for example at least one receiving pocket 24 which is open to the interior of the electronics housing 3. In this way the receiving pocket 24 can, for example, serve to receive a Hall IC, with which the rotational position of the electric motor is detected. Furthermore, in its circumferential edge region the inventive volume compensation element 11 has a sealing section 28 for pressure-tight attachment, with respect to the external atmosphere, of the volume compensation element 11 between the wall 9 and the carrier plate 7; see FIG. 3. This results in an interior 12 of the housing cover 8, which is sealed with respect to the external atmosphere or environment. Due to this sealing, no moisture can penetrate into this interior 12 from outside, whereby the electronic components 5 of the electronic circuit 4 are protected from external moisture. Because of this pressure-tight embodiment of the inventive housing it is necessary to provide a pressure compensation in order to be able to equalize pressure fluctuations in the housing, i.e. the interior 12, due to heating or cooling. The inventive volume compensation element 11 ensures this, for with an increase of the internal pressure due to temperature increase in the interior 12 of the electronics housing 3 there results a positional displacement of the membrane section 17 towards the carrier plate 7, whereby the interior volume enlarges and thus a pressure increase is reduced. With a reduction of the temperature in the interior 12, the pressure prevailing there also decreases, so that the membrane section 17 moves towards the electronic circuit 4, such that the interior volume decreases and a pressure equalization is produced. Due to the inventive volume compensation element 11, a moisture-protection of the electronic components is thus ensured on the one hand, since no moisture can enter, and on the other hand a necessary pressure equalization inside the electronics housing is caused. In the process this pressure equalization occurs in the form of a volume compensation and not by a mass balancing, like for example with the use of known pressure equalization membranes in electronics housings. At a temperature of e.g. 20° C. in the interior 12 of the housing, the membrane section assumes its initial position due to the resilient design of the connection section 18, whereby it extends in the same plane as the attachment section 16. According to the invention it can be expedient if one or more projections 25 are formed on the side of the membrane section 17 facing towards the circuit board 6, which projections 25 serve as stops for limiting the movement of the membrane section 17. According to the invention it is expediently provided that as small as possible a volume of air is present in the interior 12. This is achieved on the one hand in that the dimensions of the electronics housing 3 are chosen such that the electronic circuit 4 is disposed with small separations to the housing cover 8 and the wall 9, and the volume compensation unit 11. Moreover it can be inventively expedient, if volume elements 26 projecting into the interior 12 are disposed on the attachment section 16 of the volume compensation element 11, which volume elements 26 protrude into the free space between the electronic components 5 of the wall 9, so that the air volume inside the interior 12 is reduced.

As can be seen from FIG. 6, support domes 27 are located on the rear side of the volume compensation element 11 in the region of its attachment section 16, i.e. on the side facing towards the carrier plate 7, with which support domes 27 the volume compensation element 11 abuts on the carrier plate 7, wherein the volume compensation element 11 lies in a plane parallel to the carrier plate 7. The support domes 27 are expediently located in the vicinity of the outer edge of the volume compensation element 11. The number and arrangement of the support domes 27 is such that a full circumferential, secure support on the carrier plate 7 is ensured. Furthermore it can be seen that the volume compensation element 11 has the sealing section 28 encircling its outer edge, which sealing section 28 is formed of an elastic seal that is formed of known rubber-elastic seal material which can be injection-molded onto the attachment section 16. This sealing section 28 is formed as a profile seal, and in the state in which it is disposed on the carrier plate 7 it rests on an encircling support projection 30 of the carrier plate 7 in the edge region of the carrier plate 7, wherein the support projection 30 is inwardly offset in the direction of a base surface 32 of the carrier plate 7 with respect to an upper edge of a wheel web 31 surrounding the carrier plate 7. In the assembled state of the electronics housing 3, as illustrated in FIG. 2, the wall 9 of the housing cover 8 abuts against the encircling profile seal 28 of the volume compensation element 11 and compresses this, so that a pressure-tight sealing of the interior 12 against the external environment results.

Figure 7:
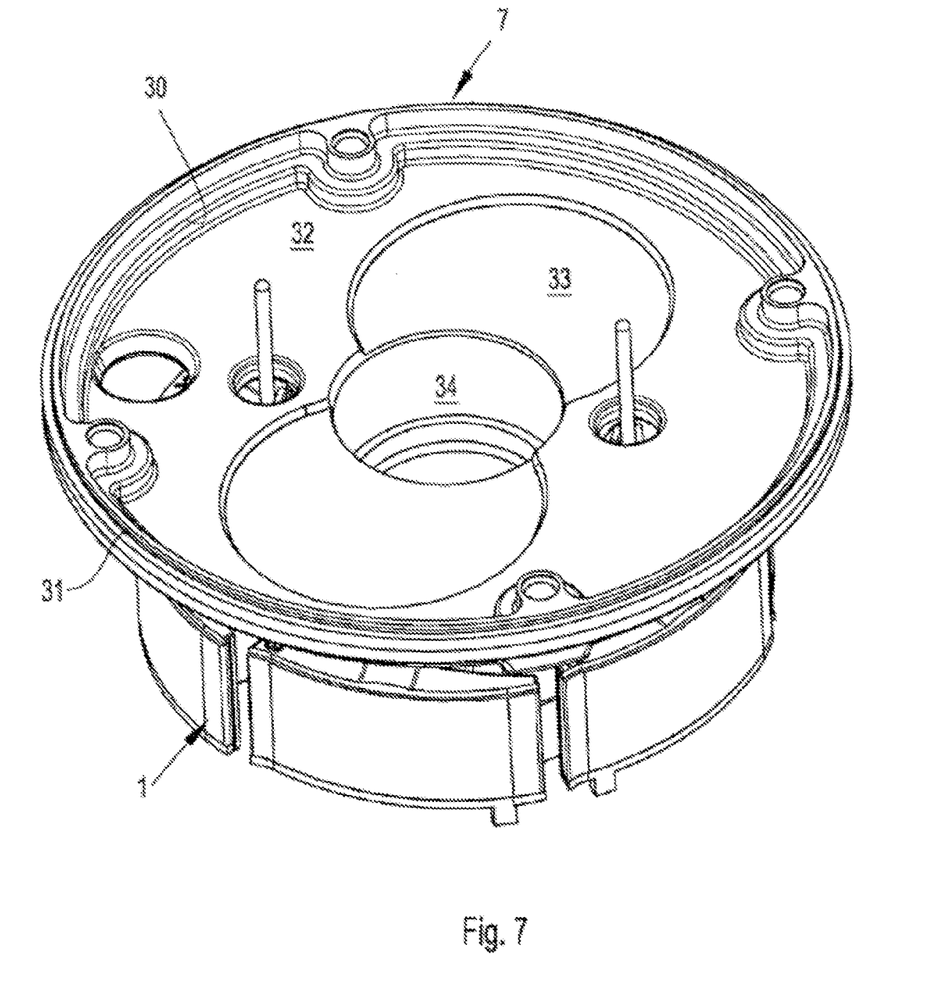
FIG. 7 shows a perspective view of the stator according to FIG. 4 without the volume compensation element.

A depression 33 is formed in the base surface 32—see FIG. 7—which is formed such that it can receive the membrane section 17 in the displaced state. An opening 34 is located in the depression 33, which opening results from the bore formed in the bearing support tube 14 and is connected e.g. to the atmosphere or environment via the one gap located between the volume compensation unit 11 and the carrier plate 7.

The attachment section has support elements 35 on its top side facing towards the circuit board 6 which protrude with respect to the top side. The circuit board 6 can be supported on the support elements 35, so that the height of the support elements 35 determines the minimum distance to the volume compensation unit 11.

Achieved by the invention is that only a minimal air volume is present in the interior 12 in comparison to the entire volume of the interior 12, so that also only a minimal amount of moisture can be enclosed in this air volume. In this way damage to the electronic components 5 due to moisture is largely avoided. Because of the pressure equalization using the volume compensation element 11 and the volume compensation caused thereby, no further moisture can enter by a material flow via the housing seal, whereby accumulation of moisture cannot occur, since no mass transport into the electronics housing occurs due to a pressure gradient between the environment and the interior. In addition, the electronics are completely sealed against the environment, which is achieved by the sealing element 28 on the edge of the inventive volume compensation element. However, instead of an injection-molded-on sealing element made from a sealing plastic material, a common O-seal-ring can also be used for sealing.

The present invention is described with reference to an electric motor including its specific components. However the invention is not limited to this application, but rather is also generally suitable for any form of housings in which electronic components are housed in a moisture-protected manner.

While the above description constitutes the preferred embodiment of the present invention, it will be appreciated that the invention is susceptible to modification, variation and change without departing from the proper scope and fair meaning of the accompanying claims.

The invention claimed is:

1. A housing for receiving an electronic circuit (4) made from a plurality of components (5) comprising a carrier plate (7) and a housing cover (8) including a circumferentially enclosing wall (9) disposed on the carrier plate (7) and a cover part (10) disposed on the wall (9), wherein the cover part (10) lies opposite the carrier plate (7), a volume compensation element (11) is attached on the carrier plate (7) in an interior (12) of the housing cover (8) which is enclosed in a pressure-tight manner with respect to an external atmosphere, the volume compensation element (11) is elastically formed such that there is a variable volume for compensation of pressure fluctuations occurring in the interior (12), which variable volume is due to a change in position of the volume compensation element (11) with respect to the carrier plate (7), and a gap between the volume compensation element (11) and the carrier plate (7) is connected to the external atmosphere, wherein an attachment section (16) of the volume compensation element (11) has a volume element (26) on a side of the attachment section facing towards the electronic circuit (4), wherein the volume element protrudes into gaps between the electronic components (5) and wherein the wall (9) and serve to reduce the air volume present in the interior (12), and wherein the volume compensation unit (11) is formed of an outer attachment section (16) and an inner membrane section (17) which are circumferentially connected to each other by a resilient connecting part (18).

2. The housing according to claim 1, further comprising in that the volume compensation element (11) is formed as a molded plastic part and the inner membrane section (17) is changeable in position with respect to the attachment section (16).

3. The housing according to claim 1 further comprising in that the volume compensation element (11) is formed as a multiple-component injection-molded plastic part.

4. The housing according to claim 1 further comprising in that sealed feed-throughs for contact pins or other electrical conductors are formed in the attachment section (16).

5. The housing according to claim 1 further comprising in that one or more receiving pockets (24) for electronic components are formed in the attachment section (16), and the receiving pockets (24) are open to the interior (12).

6. The housing according to claim 1 further comprising in that the attachment section (16) has a sealing profile (28) in a circumferential edge region for pressure-tight attachment between the wall (9) and the carrier plate (7).

7. The housing according to claim 2 further comprising in that the attachment section (16) is formed such that a parallel position with respect to the carrier plate (7) provided.

8. The housing according to claim 7 further comprising the attachment section having one or more supporting domes for mounting.

9. The housing according to claim 1 further comprising in that the inner membrane section (17) has at least one stroke-bounding projection (25) on the side facing towards the electronic circuit (4).

10. The housing according to claim 1 further comprising in that the membrane section (17) has two main sections (19) having a circular outline contour, the main sections (19) are connected to each other via a spacer section (20) whose longitudinal edges (21) are spaced from each other and concavely curved, and the membrane section (17) is formed mirror-symmetrical to a connecting line (X-X) through the midpoint (M) of the circular main section (19).

11. The housing according to claim 1 further comprising in that the carrier plate (7) has a depression (32) in the region below the membrane section (17) whose having a form and a size is such that the membrane section (17) can be received in the depression (32).

12. The housing according to claim 1 further comprising in that the electronic circuit (4) is disposed on a circuit board (6) which extends parallel to the volume compensation element (11) and preferably abuts against support elements (35) of the volume compensation unit (11).

13. The housing according to claim 1 further comprising in that the carrier plate (7) is formed as a stator flange of an electric motor.

14. The housing according to claim 13, further comprising in that a bearing support tube (14) is formed on the stator flange, and a bore located in the bearing support tube opens via an opening (34) in the gap between the volume compensation element (11) and the carrier plate (7).

\* \* \* \* \*